US008477056B2

(12) United States Patent
Sun et al.

(10) Patent No.: US 8,477,056 B2
(45) Date of Patent: Jul. 2, 2013

(54) METHOD, SYSTEM, AND APPARATUS FOR INTERPOLATING AN OUTPUT OF AN ANALOG-TO-DIGITAL CONVERTER

(75) Inventors: Han Henry Sun, Ottawa (CA); Kuang-Tsan Wu, Kanata (CA); Yuejian Wu, Ottawa (CA); Sandy Thomson, Ottawa (CA); John D. McNicol, Ottawa (CA); David J. Krause, Nepean (CA)

(73) Assignee: Infinera Corporation, Sunnyvale, CA (US)

( * ) Notice: Subject to any disclaimer, the term of this patent is extended or adjusted under 35 U.S.C. 154(b) by 9 days.

(21) Appl. No.: 12/791,694

(22) Filed: Jun. 1, 2010

(65) Prior Publication Data
US 2011/0291865 A1   Dec. 1, 2011

(51) Int. Cl.
*H03M 1/12* (2006.01)

(52) U.S. Cl.
USPC ............................................. 341/155; 341/61

(58) Field of Classification Search
USPC .................... 341/155, 61, 166, 118; 375/220, 375/354, 240, 347; 455/552
See application file for complete search history.

(56) References Cited

U.S. PATENT DOCUMENTS

| 7,414,560 B2 * | 8/2008 | Chen et al. ..................... 341/144 |
| RE42,739 E * | 9/2011 | Fortier ........................... 348/308 |
| 2005/0280569 A1 * | 12/2005 | Park .............................. 341/155 |
| 2010/0056201 A1 * | 3/2010 | Akamine et al. ........... 455/552.1 |

* cited by examiner

*Primary Examiner* — Joseph Lauture
(74) *Attorney, Agent, or Firm* — David L. Soltz

(57) ABSTRACT

A system, method, and apparatus is disclosed for interpolation of an output of an analog to digital converter (ADC) to enable operation of the ADC at a sampling rate that is independent of the sampling rate for a DSP core so as to efficiently enable operation at higher date rates. According to one of the embodiments, an interpolation circuit is coupled between the ADC and DSP core and receives a first plurality of samples of data at the first data rate from the ADC and supplies a plurality of samples of second data at a second data rate to the DSP core; the second data rate being less than the first data rate. According to one of the embodiments, the interpolation circuit includes a memory and a FIR filter circuit having filter tap coefficient values selected to provide attenuation at high frequencies to reduce aliasing noise.

36 Claims, 8 Drawing Sheets

METHOD, SYSTEM, AND APPARATUS FOR INTERPOLATING AN OUTPUT OF AN ANALOG-TO-DIGITAL CONVERTER

FIELD

The present disclosure relates generally to optical communication networks, and in particular to a method, system, and apparatus for interpolating an output of an analog-to-digital converter.

BACKGROUND

Optical communication systems are known in which optical signals carrying data are transmitted from a first node to a second or receive node over an optical fiber. At the receive node, the optical signals are converted into corresponding electrical signals, which are then further processed.

Various techniques are known for detecting or sensing the data carried by an optical signal. In one such technique, known as "coherent detection" a light source or laser, also referred to as a local oscillator, is provided at the receive node. Incoming light of the received optical signal is split by a polarization beam splitter into two orthogonal signals. Each signal combined with the light output from the local oscillator is passed through a 90-deg hybrid with four or four pairs of photodiodes detect the outputs of the two hybrids to generate the corresponding electrical signals.

A coherent detection-based receiver or coherent receiver typically includes four analog-to-digital converters (ADC). The electrical signals output from the photodiodes are typically analog signals, which are sampled at a rate greater than or equal to the symbol (baud) rate by the ADC. Theoretically, according to the Nyquist Theorem, the sampling rate can be as low as one sample per symbol, and systems have been proposed in which the sampling rate is less than or equal to twice the baud rate.

As data or baud rates increase, the ADC preferably has to have a sufficient sampling rate to accommodate such increased data rates. It is envisioned that higher overhead forward error correction (FEC) may be utilized in the future to enable further transmission distance, further increasing the required sampling rate and complexity of the ADC.

The coherent receiver in the receive node typically also includes a digital signal processor (DSP) core which receives digital signal data from the ADCs. The complexity of the design of the DSP is based at least on the sampling rate of the received digital signal data. For example, a DSP core that processes one sample per symbol is one half the complexity of a DSP core that processes two samples per symbol. Determination of the optimal sampling rate for the DSP must also take into consideration particular constraints such as power, timing, etc.

In contrast, determination of the optimum sampling rate for the ADC may take into consideration other constraints including analog bandwidth, noise, and jitter. Another constraint is the effective number of bits (ENOB) in the digitized signal, i.e., the amount of noise introduced by the A/D converter.

It is desirable that both the ADC and the DSP core circuits be optimized independently of each other. For example, the ADC may be optimized to sample at a given rate to satisfy a given set of constraints, while the DSP core may be optimized to sample at a different rate to satisfy a different set of constraints. As an example, it may be desirable for the ADC to sample at 1.8 times the baud rate in order to reduce aliasing noise, whereas a different sampling rate of 1.5 times the baud rate may be desirable for the DSP core in order to realize reduced circuit complexity and heat dissipation. One difficulty in accommodating multiple data rates in the coherent receiver is that the ADC and the associated ADC clock structure are typically tuned for performance and thus have very narrow tuning ranges. For example, an ADC designed for 23 Gigasamples per second (GS/s) typically provides only a few percent tuning range at the sampling rate. As a result, it may difficult to implement a design for a coherent receiver that accommodates this ADC requirement while also accommodating two data rates that differ by 25%, for example 40 Gb/s and 50 Gb/s.

In addition, a DSP core needed for a particular application may be designed to operate at rates that are not synchronous with the baud rate. As a result, the required ADC sampling rate can be different than the DSP sampling rate, and thus making the ADC incompatible with the DSP. It is desirable to have an apparatus, method, and system for implementation of multiple data rates for the coherent receiver circuitry, such that the ADC operates at a sampling rate that is independent of the sampling rate of the DSP to enable operation at higher baud rates and with higher FEC overhead.

SUMMARY

Consistent with an aspect of the present disclosure, broadly stated, an apparatus is provided comprising an analog-to-digital converter (ADC) circuit configured to receive an input signal and sample the input signal at a sampling rate to supply a first plurality of samples of first data at a first data rate; a memory configured to receive the first plurality of samples of the first data at the first data rate and output a second plurality of samples of the first data at a second data rate less than the first data rate; a filter circuit configured to receive the second plurality of samples of the first data from the memory at the second data rate and supply a plurality of samples of second data at the second data rate; and a digital signal processor, a portion of which being configured to receive the plurality of samples of second data at the second data rate. Consistent with another aspect of the present disclosure, broadly stated, an apparatus is provided comprising an analog-to-digital converter (ADC) circuit configured to receive an input signal and sample the input signal at a sampling rate to supply a first plurality of samples of first data at a first data rate; an interpolation circuit configured to receive the first plurality of samples of the first data at the first data rate and supply a plurality of samples of second data at a second data rate, the second data rate being less than the first data rate; and a digital signal processor, a portion of which being configured to receive the plurality of samples of the second data at the second data rate.

Consistent with another aspect of the present disclosure, broadly stated, a system is provided comprising a transmitter configured to output an optical signal; a photodiode configured to receive a portion of the optical signal and generate an electrical signal in response thereto; an analog-to-digital converter (ADC) circuit supplying a first plurality of samples of first data at a first data rate based, at least in part, on the electrical signal; an interpolation circuit configured to receive the first plurality of samples of the first data and supply a plurality of samples of second data at a second data rate, the second data rate being less than the first data rate; and a digital signal processor, a portion of which being configured to receive the plurality of samples of the second data at the second data rate, the second data rate being less than the first data rate.

Consistent with another aspect of the present disclosure, broadly stated, an apparatus is provided comprising an analog-to-digital converter (ADC) circuit configured to receive an input signal and sample the input signal at a sampling rate to supply a first plurality of samples of first data at a first data rate; and a digital signal processor including an interpolation circuit configured to receive the first plurality of samples of the first data at the first data rate and supply a plurality of samples of second data at a second data rate, the second data rate being less than the first data rate; and a portion configured to receive the plurality of samples of the second data at the second data rate.

It is to be understood that both the foregoing general description and the following detailed description are exemplary and explanatory only and are not restrictive of the invention, as claimed.

The accompanying drawings, which are incorporated in and constitute a part of this specification, illustrate exemplary embodiments of the present disclosure and together with the description, serve to explain the principles of the present disclosure.

DESCRIPTION OF THE EMBODIMENTS

According to one aspect of the present disclosure, a sampling rate conversion is implemented to reduce the hardware complexity in the implementation of a coherent receiver having an ADC circuit and a DSP circuit by enabling each of the circuits to operate at a different sampling rate. According to another aspect, a filter circuit provided for the sampling rate conversion is implemented so as to reject high frequency aliasing noise.

An advantage of the present disclosure is to enable optimization of the sampling rates of both the ADC and DSP core circuits of a coherent receiver to enable efficient operation of optical communication systems both at higher data rates (e.g., 40 Gb/s or 100 Gb/s, etc.) and with higher overhead FEC to achieve greater transmission distances. Another advantage provided by at least one aspect of the present disclosure is to increase the simplicity and flexibility of the design for a coherent receiver having an ADC and a DSP core, e.g., increase flexibility in finding a suitable ADC to use with a particular DSP core for higher data rate applications.

Reference will now be made in detail to the exemplary embodiments of the present disclosure, examples of which are illustrated in the accompanying drawings. Wherever possible, the same reference numbers will be used throughout the drawings to refer to the same or like parts.

Figure 1:
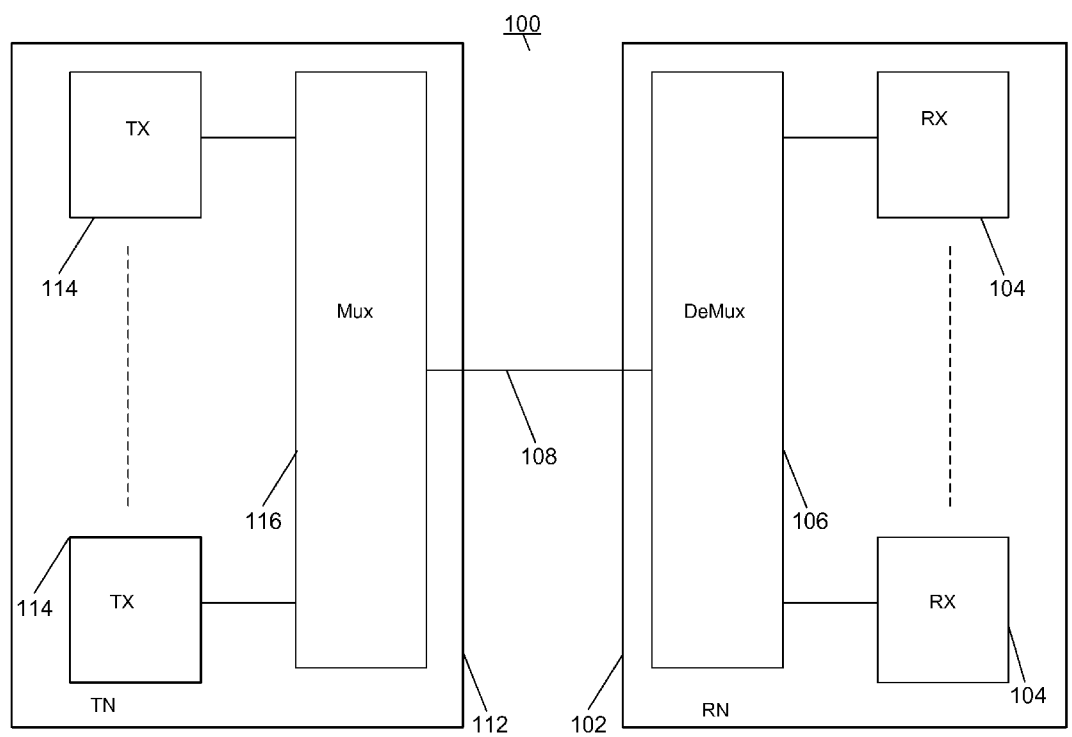
FIG. 1 is a block diagram illustrating a system for transmitting and receiving of optical signals.

FIG. 1 is a block diagram illustrating a system 100 for transmitting and receiving optical signals. System 100 includes a Transmit Node (TN) 112 that includes a plurality of optical transmitters (TX) 114, each TX 114 converting an electrical signal to an optical signal having one of a plurality of wavelengths. Each TX 114 is coupled to a Multiplexer (Mux) 116 that combines the optical signals onto an optical fiber medium, identified as line 108 in FIG. 1. The combined optical signals may constitute a wavelength division multiplexed (WDM) optical signal that is supplied to a Receive Node (RN) 102, which receives and demultiplexes the WDM optical signal with a demultiplexer (Demux) 106, which supplies each optical signal to each of a corresponding one of a plurality of receivers (RX) 104. Each of receivers 104 may constitute a coherent receiver, as discussed in greater detail below with reference to FIGS. 2 and 3.

Figure 2:
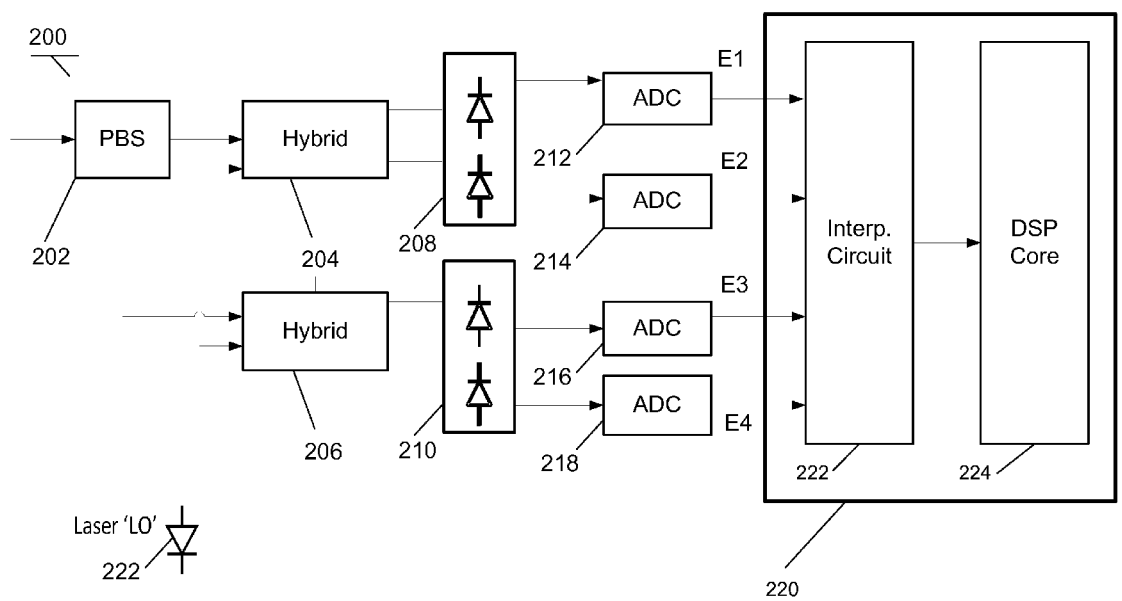
FIG. 2 is a block diagram illustrating a coherent receiver block according to an embodiment of the present disclosure.

FIG. 2 is a block diagram illustrating a coherent receiver 200 according to an embodiment of the present disclosure. The coherent receiver 200 may detect not only the amplitude of the optical signal, but also its phase and polarization. In one example, a polarization multiplexed optical signal is supplied to receiver 200. In that case, receiver 200 may include a polarization beam splitter (PBS) 202 operable to receive the input optical signal and to separate the signal into orthogonal polarizations, also referred to as X and Y polarizations; i.e., vector components of the optical E-field of an incoming optical signal transmitted on optical fiber medium 108. The orthogonal polarizations are then mixed with a laser local oscillator (LO) 222 reference through hybrids 204, 206. The Hybrids 204, 206 each outputs two signals, the four signals representing the in-phase and quadrature components of the optical E-field on X and Y polarizations. The composite signals at the output of the hybrids 204, 206 are supplied to respective photodiodes in a set of photodetectors 208, 210, to generate four analog electrical output signals (E1 to E4), for example.

The four output signals E1 to E4 from the photodiodes in photodetectors 208, 210 comprise four base-band analog electrical signals linearly proportional to the in-phase and quadrature components of the optical E-field on X and Y polarizations. After amplification and or other processing, the analog signals are then sampled at a sampling rate by respective analog-to-digital converter (ADC) circuits 212, 214, 216, 218, each coupled to a corresponding one of the photodiodes of photodiode pair 208. Each of the ADC circuits 212, 214, 216, 218 is configurable to supply a corresponding one of a plurality of digital signals to a Digital Signal Processor (DSP) 220. In the example in FIG. 2, the DSP 220 includes an Interpolation (Interp.) circuit 222 and a DSP core 224.

Figure 3:
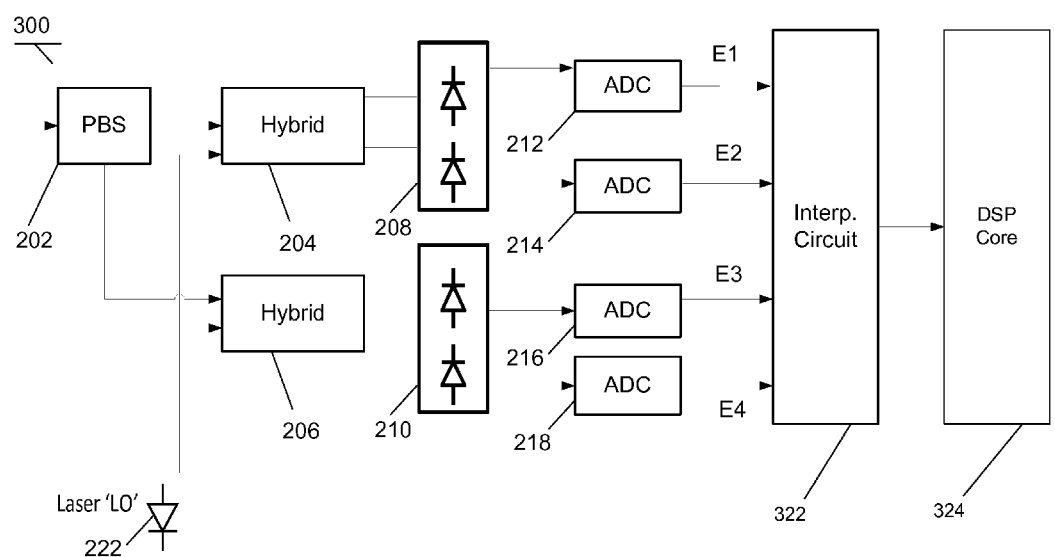
FIG. 3 is a block diagram illustrating a coherent receiver block according to an alternate embodiment of the present disclosure.

FIG. 3 is a block diagram illustrating a coherent receiver block according to an alternate embodiment of the present disclosure. More specifically, FIG. 3 illustrates a coherent receiver 300 according to an alternative embodiment wherein the Interpolation (Interp.) circuit 322 and DSP core 324 are included in different integrated circuits. In other words, the DSP core 324 may be embodied in a corresponding DSP circuit, whereas the interpolation circuit 322 may be embodied in a separate integrated circuit.

Figure 4:
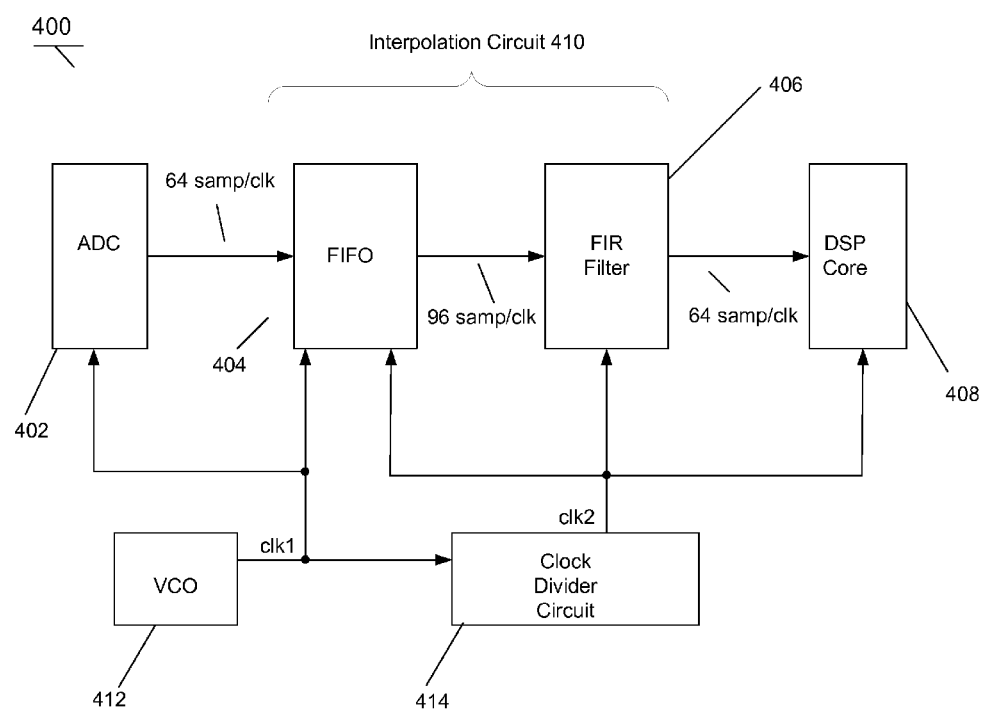
FIG. 4 is a diagram illustrating an apparatus including an interpolation circuit coupled between an ADC and a DSP core according to an embodiment of the present disclosure.

FIG. 4 is a diagram illustrating an apparatus 400 including an interpolation circuit 410 coupled between an ADC 402 and a DSP core 408 according to an embodiment of the present disclosure. In the example in FIG. 4, the interpolation circuit 410 includes a memory, shown as first in first out memory (FIFO) 404, and a Finite Impulse Response (FIR) Filter 406. Although the memory is shown as a FIFO in the example FIG. 4, the memory is not limited to being a FIFO; any suitable memory that functions according to the present disclosure may be used.

The apparatus 400 also includes a voltage controlled oscillator (VCO) 412, and a clock divider circuit 414. The VCO 412 supplies a clock signal clk1 to the ADC 402, the FIFO 404, and the clock divider circuit 414. The clock divider circuit outputs a clock signal clk2 in response to receipt of the clock signal clk1 from the VCO 412. The FIFO 404, FIR filter 406, and DSP core 408 each receive the clock signal clk2 supplied from the clock divider circuit 414. The clock signal clk2 is provided to time the input to FIFO 404, and the clock signal clk2 is provided to time the output of FIFO 404, as explained further below.

The operation of the apparatus 400 will now be further explained by way of example where it is assumed that the ADC outputs 64 data samples per clock cycle. Note that, in this example, the clock here has a rate which is 1/64 of the actual ADC sampling rate. Although the operation may be described with respect to certain number of samples and clock rates (or data rates), it is understood that the present disclosure is not limited to specific clock rates and sampling rates described herein. Rather, any appropriate number of clock and sampling rates are contemplated by the present disclosure. Each of the samples described herein includes a number of bits.

In the present example, ADC 402 operates at one data rate or clock rate, clk1, whereas the DSP core operates at a different, e.g., lower, data rate or clock rate, clk2. Thus, for the same number of samples per clock cycle, the timing at which data or samples are output from the ADC 402 is different than the timing at which the data or samples are received and operated on by DSP core 408. Thus an interpolation may be needed in order to calculate a different set of samples having a timing that corresponds to the timing of the DSP sampling rate, i.e., a calculation of what the sample at the new timing would have been if the ADC 402 had been operating at the same lower rate as the DSP core 408 operates. Such timing may be referred to herein as a "time stamp."

Figure 6:
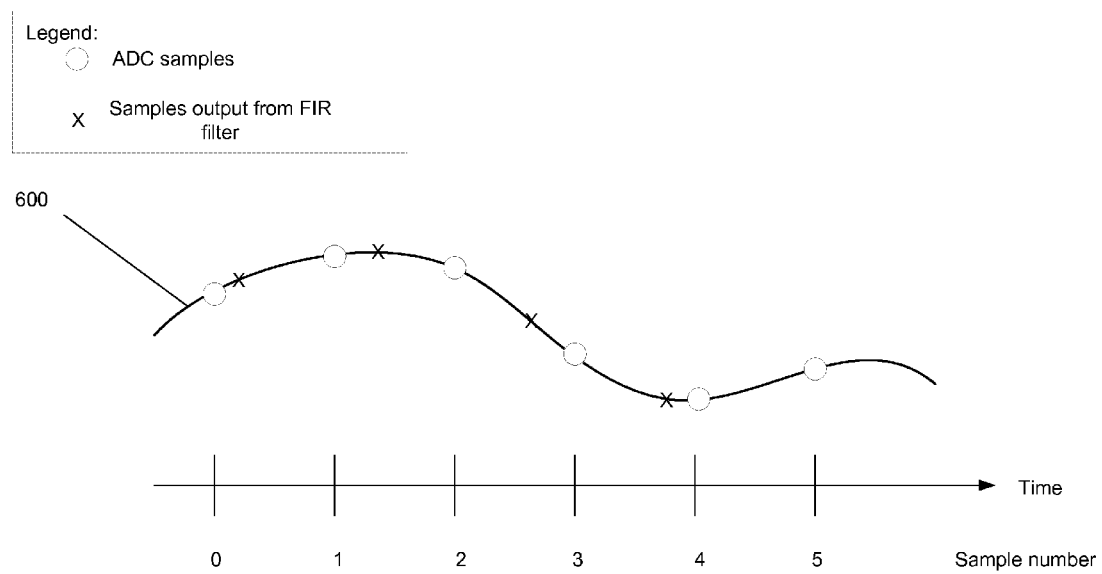
FIG. 6 is a timing diagram showing exemplary timing for the data sample output from the ADC samples and data samples output from the FIR filter according to an aspect of the present disclosure.

FIG. 6 is a timing diagram showing exemplary timing for the data sample output from the ADC samples and data samples output from the FIR filter 406 (i.e., input to the DSP core 408) in FIG. 4 according to an aspect of the present disclosure. The waveform 600 is the original analog waveform that is supplied to ADC 402. The time axis of waveform 600 includes time stamp indicators for ADC samples 0, 1, 2, 3, 4, and 5. The circles on waveform 600 also represent the points on the waveform 600 corresponding to the ADC 402 samples 0, 1, 2, 3, 4, and 5. The X's on waveform 600 indicate the (desired) samples output from the FIR filter 406 to be supplied to the DSP core 408. Thus each "X" represents a calculation needed for what each sample would have been at the different time stamp if the ADC 402 had been operating at the same lower rate as the DSP core 408 operates. The structure and operation for implementing the calculations are described further below.

In the above example, the ADC outputs 64 data samples per clock cycle. In the apparatus 400 in FIG. 4, a clock signal clk1 is supplied to the ADC 402, thus the ADC 402 supplies 64 samples per cycle of clock signal clk1 to FIFO 404. Clock signal clk1 is supplied to FIFO 404, such that the FIFO 404 receives the 64 samples per cycle of clock signal clk1. The output of FIFO 404 is clocked, however, at a different rate. The clock rate for the output of FIFO 404 is determined by the clock signal clk2. The frequency of clock signal clk1 may be divided by the clock divider circuit 414 to supply the clock signal clk2 at a lower frequency, i.e., the clock signal clk2 may be some fraction (e.g., 2/3) of the frequency of the clock signal clk1.

According to an embodiment of the present disclosure for the exemplary clock rate, the FIFO 404 receives data samples from the ADC 402 at the rate of 64 samples per clock signal clk1 (the clock rate of both the ADC 402 and the input of the FIFO 404). For this example, the FIFO 404 outputs 96 data samples to the FIR filter 406 at a rate of 96 samples per clock signal clk2. The clock signal clk2 is thus 64/96 (i.e., 2/3) of the frequency of the clock signal clk1 as divided by the clock divider circuit 414 according to this example. Accordingly, the clock rate at the output of FIFO 404 is reduced compared to the clock rate at the input, by a factor of 64/96 or 2/3 for this example. As a result, the FIFO 404 receives 64 samples per cycle of clock signal clk1 and outputs 96 samples per cycle of a slower clock signal, clock signal clk2; i.e. more samples (96) are output at the slower clock rate (reduced by 64/96) according to this example. The input to the FIFO 404 is clocked at a higher rate and the output of the FIFO 404 is clocked at a lower rate, with the rate conversion factor being 64/96 (2/3) according to this example. In the above example, the FIFO 404 supplies 96 samples per cycle of clock signal clk2 to the input of a filter circuit. The filter circuit is preferably a FIR filter 406 and included in the interpolation circuit 410 as shown in FIG. 4.

For operation in this example, interpolation circuit 410 receives 64 samples per cycle of clock signal clk1 from the ADC 402, and calculates 64 samples per cycle of clock signal clk2 to be output (from the FIR filter 406) to the DSP core 408. Thus, new time stamps and values are calculated for the samples output from FIR filter 406 to the input of the DSP core 408, as is further described below.

As noted above, the FIR filter 406 receives 96 samples per cycle of clock signal clk2 and calculates 64 samples per cycle of clock signal clk2 to be output to the DSP core 408, for this example.

Figure 5:
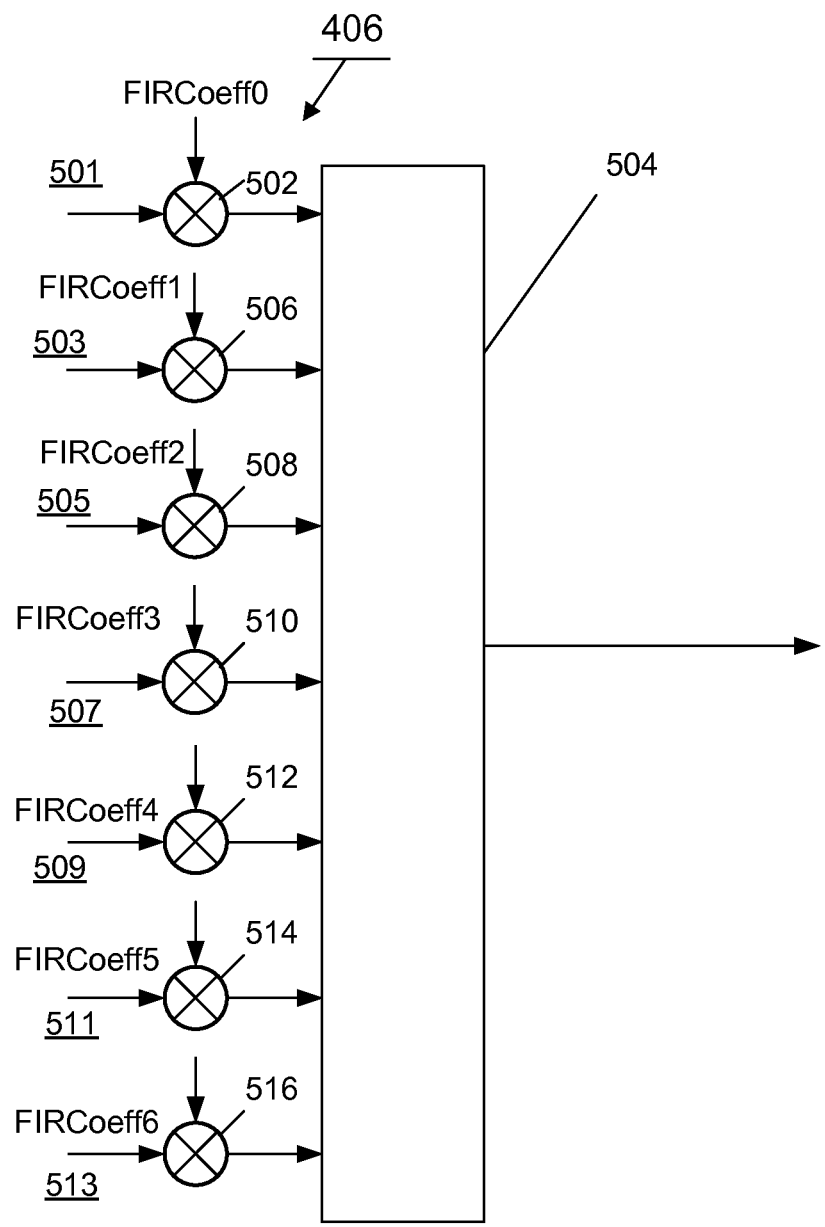
FIG. 5 is a diagram illustrating an exemplary seven tap Finite Impulse Response (FIR) Filter according to an aspect of the present disclosure.

An example of the FIR filter 406 is shown in FIG. 5. FIR filter or filter circuit 406, in this example, has seven inputs or taps 501, 503, 505, 507, 509, 511, and 513 that receive data from FIFO 404. The FIR filter 406 also includes multipliers 502, 506, 508, 510, 512, 514, and 516, filter coefficients FIRCoeff0, FIRCoeff1, FIRCoeff2, FIRCoeff3, FIRCoeff4, FIRCoeff5 and FIRCoeff6, and block 504.

Each of the output samples from FIFO 404 is supplied to a corresponding input or tap 501, 503, 505, 507, 509, 511, and 513 of FIR filter 406 and to a corresponding multiplier 502, 506, 508, 510, 512, 514, and 516. which multiplies the corresponding output sample data by the corresponding coefficient FIRCoeff0, FIRCoeff1, FIRCoeff2, FIRCoeff3, FIRCoeff4, FIRCoeff5, and FIRCoeff6. The resulting products are then summed in block 504 to yield the output of the FIR filter 406. Table 1 is included below to further illustrate the operation of the FIR filter 406 in FIG. 5.

TABLE 1

| Output-Data[k] | InputData[n] start | InputData[n] stop | FIRCoeff[i] | | | | | | |
|---|---|---|---|---|---|---|---|---|---|
| | | | i = 0 | i = 1 | i = 2 | i = 3 | i = 4 | i = 5 | i = 6 |
| k | n | n | | | | | | | |
| 0 | 0 | 6 | −4 | −11 | 57 | 127 | 57 | −11 | −4 |
| 1 | 2 | 8 | −11 | 11 | 105 | 105 | 11 | −11 | 1 |
| 2 | 3 | 9 | −4 | −11 | 57 | 127 | 57 | −11 | −4 |
| 3 | 5 | 11 | −11 | 11 | 105 | 105 | 11 | −11 | 1 |
| 4 | 6 | 12 | −4 | −11 | 57 | 127 | 57 | −11 | −4 |
| 5 | 8 | 14 | −11 | 11 | 105 | 105 | 11 | −11 | 1 |
| 6 | 9 | 15 | −4 | −11 | 57 | 127 | 57 | −11 | −4 |
| 7 | 11 | 17 | −11 | 11 | 105 | 105 | 11 | −11 | 1 |

The table includes columns for the output data (k) (samples 0-7 to be supplied by the FIR filter 406 to the DSP core 408), two Input data (n) columns (for input data supplied to the FIR filter 406, e.g., from FIFO 404 in FIG. 4), and FIRcoeff(i) (i=0-6 FIRcoeff0-FIRcoeff6). An advantage of FIR filter circuit 406 is that the above filter coefficients may be selected to have a low-pass characteristic. As a result, high frequency aliasing noise can be rejected.

The input data (n) columns include a start (n) column and a stop (n) column for indicating the range of input samples to be multiplied with the corresponding filter coefficients. According to the row for OutputData[k] where k=0 (i.e., OutputData0) in Table 1, for example, InputData samples 0 through (0:6) are multiplied by the corresponding filter coefficients. For k=1, OutputData[1], however, InputData samples 2:8 are used instead of 1:7. As can be seen in Table 1, the pattern includes skipping over certain samples for the start of the next input data ranges and repeats for every two output samples (e.g., InputData samples 0:6 for OutputData0, InputData samples 2:8 for OutputData1, InputData samples 3:9 for OutputData2, InputData samples 5:11 for OutputData3, and so on). Such skipping is due to the rate conversion since each output sample from the FIR filter 406 (supplied to the DSP core 408) spans more time than each input sample from the ADC, i.e., 64 sample per clock cycle output from ADC 402 and 64 samples per clock input to the DSP core 408. However, the clock rate for the ADC 402 is clk1 and the clock rate for the DSP core 408 is the divided lower clock rate clk2. For example, assuming the ADC 402 is operating at a rate of 1.8 samples per symbol and the DSP core 408 operates at a different rate. The time stamp for the samples at the output of the FIR filter 406 to be supplied to the DSP core 408 is different than the time stamp for the samples at the ADC 402, due to the different clock rates for the ADC 402 and the DSP core 408, as also illustrated in FIG. 6.

Figure 7:
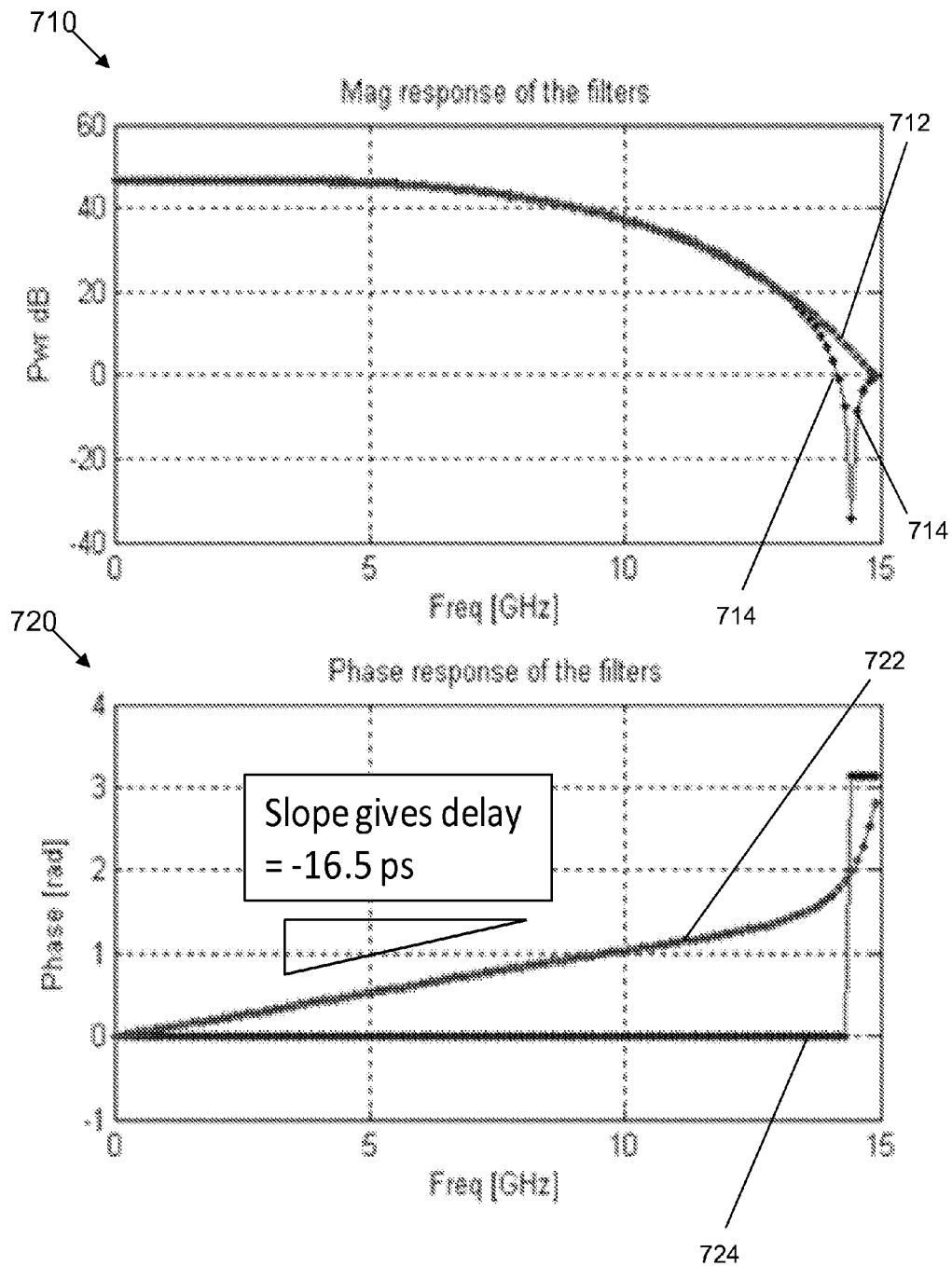
FIG. 7 illustrates two exemplary timing diagrams further illustrating the magnitude and frequency response of the FIR Filter in FIG. 5 for two distinct sets of filter coefficients according to an embodiment of the present disclosure.

Table 1 includes two sets of filter coefficients, (i.e., FIRCoeff0, FIRCoeff1, FIRCoeff2, FIRCoeff3, FIRCoeff4, FIRCoeff5, and FIRCoeff6) being −4, −11, 57, 127, 57, −11, and −4 respectively for one set, and being −11, 11, 105, 105, 11, −11, and 1 for the other set). The reason for having only two sets of filter coefficients is because in this example the rate change is 2/3, i.e., every 3 samples from ADC output are down-sampled to 2 samples to the DSP core. Note also that the coefficients shown here were calculated based on one example of implementation. Other sets of filter coefficients are possible with some sorts of optimization criterion. FIG. 7 includes two exemplary timing diagrams further illustrating the magnitude (mag) and phase response of the FIR filter 406 of FIG. 5 for the two sets of filter coefficients according to an aspect of the present disclosure. For the figure, the magnitude and phase response were generated by the FFT of the zero-padded filter coefficients. The magnitude (Mag) response 710 is shown in waveforms 712 and 714, and phase response 720 is shown in waveforms 714 and 712, both for the respective filter coefficients sets. As can be seen, the phase response 720 shows a delay of 0 picoseconds (ps) for the first set (waveform 724), and −16.5 ps delay for the second set (waveform 722). The total delay required for the output samples is generated by the delay provided by the FIR filter in conjunction with the selection of the input data range for a particular output data sample, as explained further below with reference to Table 2.

For the example in Table 2, it is assumed that the desired ADC for a particular design (e.g., ADC 402 in FIG. 4) samples input data at 30 Gigasamples per second (30 GS/s) and a desired DSP core (e.g., DSP core 408) samples output data at a different rate, 20 GS/s. Table 2 includes columns for the Input Data Index, Input Data Delay, Filter Delay, and Net Delay. Table 2 also includes columns for the Output Data Index and the Required Output Data Delay.

TABLE 2

Assume input data is sampled at 30 GS/s, output data is sampled at 20 GS/s

| Input Data Index | Input Data Delay [ps] | Filter Delay [ps] | Net Delay [ps] | Output Data Index | Required Output Data Delay [ps] |
|---|---|---|---|---|---|
| 0 | 0.0 | 0.0 | 0.0 | 0 | 0 |
| 2 | 66.7 | −16.5 | 50.1 | 1 | 50 |
| 3 | 100.0 | 0.0 | 100.0 | 2 | 100 |
| 5 | 166.7 | −16.5 | 150.1 | 3 | 150 |
| 6 | 200.0 | 0.0 | 200.0 | 4 | 200 |
| 8 | 266.7 | −16.5 | 250.1 | 5 | 250 |
| 9 | 300.0 | 0.0 | 300.0 | 6 | 300 |
| 11 | 366.7 | −16.5 | 350.1 | 7 | 350 |

The Required Output Data Delay for each output data index is shown in the two rightmost columns respectively for the 20 GS/s sampling rate. The period or delta time between samples for a sampling rate of 20 GS/s being 1/20 GHz, thus the required output data delays are 50 ps apart (0, 50 ps=1/20 GHz, 100 ps=2/20 GHz, etc.). Table 2 shows the input data and filter delays calculated in order to interpolate to provide the required output delay, i.e., the interpolation to determine the output sample value and corresponding time stamp from the input data sample value and its corresponding time stamp, as explained in further detail below.

The first column in Table 2 is the Input Data Index which is copied from the "start n" input data (index) column in Table 1, i.e., 0, 2, 3, 5, 6, 8, 9, and 11. As can be seen, the "start n" (Input Data Index) values do not increase linearly, but instead skip certain values since due to the rate conversion each of the output samples spans more delta time than the input samples.

The input sampling rate is 30 GS/s, and, therefore, the second column in Table 2 shows a different Input Data Delay for each of the Input Data Index values in the first column (i.e., the Input Data Delay for the Input Data Index=2 is calculated to be 2/30 GHz=66.7 ps; the Input Data Delay for Input Data Index=3 is 3/30 GHz=100 ps, etc.)

The Filter Delay in the third column is either 0.0 ps or −16.5 ps from the slopes of the phase response for the waveforms 724 and 722 in FIG. 7.

The Net Delay in the fourth column is the sum of the Input Data Delay and Filter Delay columns (e.g., the Net Delay for Input Data Index 2 is 66.7 ps+(−16.5 ps)=50.1 ps, etc.)

The Output data index in the fifth column runs linearly from 0 to 7.

The Required Output Data Delay for each output data index is shown in the two rightmost columns respectively for the 20 GS/s sampling rate. The period or delta time between samples for a sampling rate of 20 GS/s being 1/20 GHz, thus the required output data delays are 50 ps apart (0, 50 ps=1/20 GHz, 100 ps=2/20 GHz, etc.)

As seen in Table 2, the Net Delay in the fourth column essentially matches the Required Output Data Delay values (i.e., 50.1 and 50, 100.0 and 100, 150.1 and 150, etc.), thus demonstrating that the Input Data Index used and the corresponding Input Data Delay, added to the Filter Delay, (e.g., 50.1) results in the correct interpolation of the Output Data Delay for the output. As a result, the desired rate conversion of (20 GS/s)/(30 GS/s)=2/3 is achieved for this example.

Table 2 shows that the interpolation circuit (i.e., 410 in FIG. 4) and the choice of the specific coefficient values for the FIR filter 406 therein (i.e., an exemplary embodiment of the FIR filter 406 in FIG. 4) achieve the 2/3 rate conversion in this example. In addition, since the output of the interpolation circuit 410 is sampled at a lower sampling rate than the data input from the ADC 402, there is attenuation at high frequencies, thus also substantially reducing aliasing noise.

Preferably, the length or capacity of FIFO 404 in FIG. 4*a* should cover at least the desired number of samples per clock cycle clk2 plus the length of filter coefficients for proper filtering at the boundaries of data samples.

According to one embodiment the coefficients of FIR filter 406 are precalculated and fixed, as shown above. Alternatively, the coefficients may be adaptable for optimization in real-time.

The FIR filter 406 in FIG. 4 and shown in greater detail in FIG. 5 are described herein is a preferred way to calculate the interpolation. Although other interpolation methods such as linear interpolation, quadratic interpolation might instead be used to provide the required interpolation for the present disclosure, the use of the FIR filter according to the present disclosure reduces the errors in interpolation (e.g., due to jitter) and also provides for shaping the data spectrum to reject high frequency aliasing noise, as described above.

Figure 8:
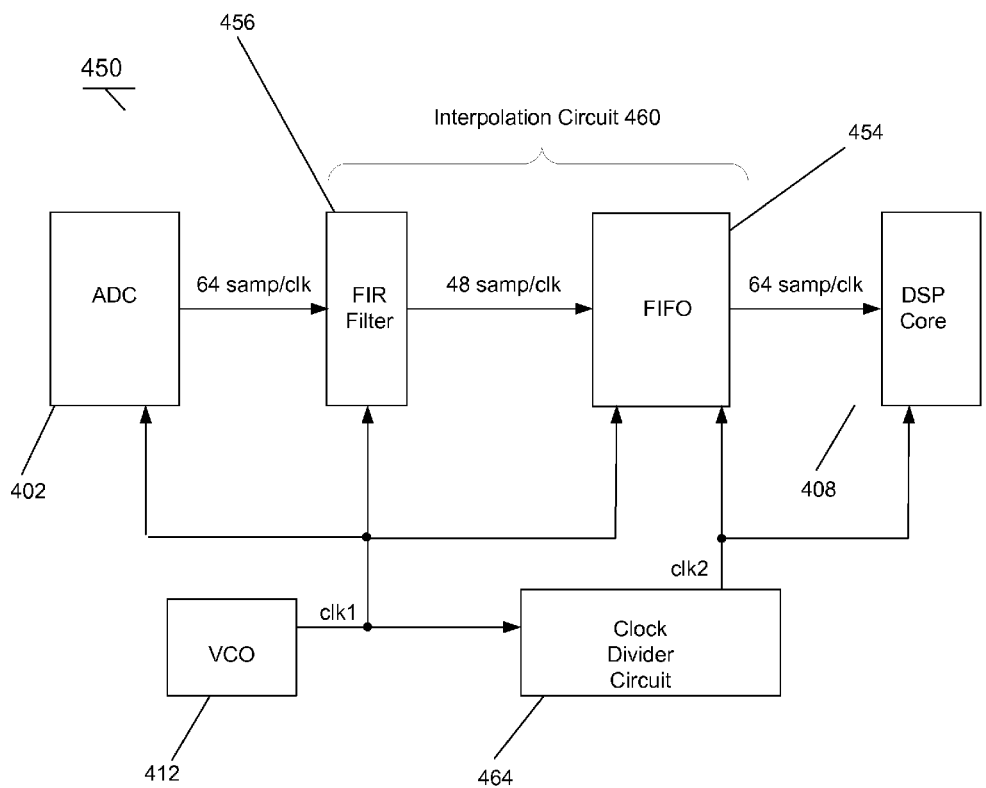
FIG. 8 is a diagram illustrating an alternative interpolation circuit consistent with a further aspect of the present disclosure.

An alternative interpolation circuit 460 will next be described with reference to FIG. 8 in which the FIR filter and FIFO memory are reversed. In particular, FIG. 8 shows an apparatus 450 including ADC circuit 402 (similar to that discussed above in connection with FIG. 4) that supplies samples at a given clock rate (clk1) provided by VCO 412. For example, ADC circuit 402 may supply 64 samples each clock cycle of clk1. FIR filter 456 may be appropriately configured to output 48 samples each clock cycle in further response to the output of VCO 412. The samples output from FIR filter 456 are next supplied to FIFO memory 454 at the same rate that samples are output from FIR filter 456, which, in this example is 48 samples each clock cycle of clk1. The samples are output from FIFO 458 at a rate less than the rate at which the samples are fed to FIFO 54. For example, samples may be output from FIFO 454 for processing by DSP core 408 at a rate of 64 samples per clock cycle of clock signal clk2, the clock frequency. However, clk2 runs slower than clk2, e.g., clk2=48/64 clk1, such that the number of samples output from FIFO 454 equals the number of samples input to FIFO 454. The coefficients of FIR filter 456 may be selected in a manner similar to that discussed above in connection with filter 404 to provide interpolated samples at the reduced sampling rate to thereby accommodate the clock rate of DSP core 408.

As further shown in FIG. 8, clock divider circuit generates clock signal clk2 in response to clock clk1 output from VCO 412.

As noted above, interpolation of an output of an analog to digital converter (ADC) is described to enable operation of the ADC at a sampling rate that is independent of the sampling rate for a DSP core of a coherent receiver. The apparatus and system for interpolation may also be implemented as a corresponding method in accordance with the interpolation process described in the present disclosure. The interpolation substantially increases flexibility in finding a suitable ADC to use with a particular DSP core to enable efficient operation of a coherent receiver required to operate at higher data rates (e.g., 40 Gb/s or 100 Gb/s) and for higher overhead FEC. The flexibility, efficiency, and reduced complexity provided by the apparatus, system, and corresponding method according to the present disclosure is in contrast to conventional designs which may be unable to operate with a desired DSP core in combination with a desired ADC for a particular application and thus be unable to operate suitably at higher data rates and with higher FEC overhead.

Other embodiments will be apparent to those skilled in the art from consideration of the specification. For example, the samples discussed above may have the same or different numbers of bits. It is intended that the specification and examples be considered as exemplary only, with a true scope and spirit of the invention being indicated by the following claims.

What is claimed is:

1. An apparatus, comprising:
   an analog-to-digital converter (ADC) circuit configured to receive an input signal and sample the input signal at a sampling rate to supply a first plurality of samples of first data at a first data rate;
   a memory configured to receive the first plurality of samples of the first data at the first data rate and the memory having circuitry that outputs a second plurality of samples of the first data at a second data rate less than the first data rate;
   a filter circuit configured to receive the second plurality of samples of the first data from the memory at the second data rate and supply a plurality of samples of second data at the second data rate; and
   a digital signal processor, a portion of which being configured to receive the plurality of samples of second data at the second data rate,
   wherein each of the first plurality of samples of the first data includes a first number of bits, each of the second plurality of samples of the first data includes a second number of bits, and each of the plurality of samples of the second data includes a third number of bits, the first number of bits being equal the second number of bits, and the first number of bits being equal to the third number of bits.

2. An apparatus in accordance with claim 1, an apparatus in accordance with claim 1, wherein the memory includes a first-in-first-out (FIFO) buffer circuit.

3. An apparatus in accordance with claim 1, wherein the ADC circuit supplies the first plurality of samples of the first data at the first data rate under control of a clock circuit.

4. An apparatus in accordance with claim 3, wherein the clock circuit includes a voltage controlled oscillator (VCO).

5. An apparatus in accordance with claim 1, further including:
   a clock circuit configured to generate a first clock signal; and
   a clock divider circuit, which receives the first clock signal, the clock divider circuit being configured to output a second clock signal in response to the first clock signal;
   wherein the memory receives the first plurality of samples of the first data at the first data rate in response to the first clock signal; and wherein the memory outputs the second plurality of samples of the first data at the second data rate in response to the second clock signal.

6. An apparatus in accordance with claim 1, wherein a ratio of a number of the first plurality of samples to a number of the second plurality of samples is equal to a ratio of the second data rate to the first data rate.

7. An apparatus in accordance with claim 1, wherein the filter circuit includes a finite-impulse response (FIR) filter circuit.

8. An apparatus in accordance with claim 1, wherein the plurality of samples of second data have an associated second frequency, the filter circuit being configured to attenuate signals having a first frequency greater than the second frequency, such that the filter circuit is configured to have a low-pass characteristic.

9. An apparatus in accordance with claim 8, wherein the filter circuit reduces aliasing noise.

10. An apparatus, comprising:
an analog-to-digital converter (ADC) circuit configured to receive an input signal and sample the input signal at a sampling rate to supply a first plurality of samples of first data at a first data rate;
a circuit configured to receive the first plurality of samples of the first data at the first data rate and supply a plurality of samples of second data at a second data rate, the second data rate being less than the first data rate;
a digital signal processor, a portion of which being configured to receive the plurality of samples of the second data at the second data rate;
a clock circuit configured to generate a first clock signal; and
a clock divider circuit, which receives the first clock signal, the clock divider circuit being configured to output a second clock signal in response to the first clock signal;
wherein the circuit configured to receive the first plurality of samples receives the first plurality of samples of the first data at the first data rate in response to the first clock signal; and
wherein the circuit supplies the plurality of samples of second data at the second data rate in response to the second clock signal.

11. An apparatus in accordance with claim 10, wherein the circuit includes:
a memory configured to receive the first plurality of samples of the first data at the first data rate and having circuitry to output a second plurality of samples of the first data at a second data rate less than the first data rate; and
a filter circuit configured to receive the second plurality of samples of the first data from the memory at the second data rate and supply a plurality of samples of second data at a second data rate.

12. An apparatus in accordance with claim 11, wherein the filter circuit includes a finite-impulse-response (FIR) circuit.

13. An apparatus in accordance with claim 12, wherein the filter circuit reduces aliasing noise.

14. An apparatus in accordance with claim 10, wherein the ADC circuit supplies the first plurality of samples of the first data at the first data rate under control of a clock circuit.

15. An apparatus in accordance with claim 14, wherein the clock circuit includes a voltage controlled oscillator (VCO).

16. An apparatus in accordance with claim 10, wherein the plurality of samples of second data have an associated second frequency, the apparatus including a filter circuit being configured to attenuate signals having first frequency greater than the second frequency, such that the filter circuit is configured to have a low-pass characteristic.

17. A system, comprising:
a transmitter configured to output an optical signal;
a photodiode configured to receive a portion of the optical signal and generate an electrical signal in response thereto;
an analog-to-digital converter (ADC) circuit supplying a first plurality of samples of first data at a first data rate based, at least in part, on the electrical signal;
a circuit configured to receive the first plurality of samples of the first data and supply a plurality of samples of second data at a second data rate, the second data rate being less than the first data rate;
a digital signal processor, a portion of which being configured to receive the plurality of samples of the second data at the second data rate, the second data rate being less than the first data rate; and
a plurality of transmitters, each of which supplying a corresponding one of a plurality of optical signals, the transmitter being one of the plurality of transmitters and the optical signals being one of the plurality of optical signals, each of the plurality of optical signals having a corresponding one of a plurality of wavelengths.

18. A system in accordance with claim 17, wherein a number of the first plurality of samples of the first data is equal to a number of the plurality of samples of the second data.

19. A system in accordance with claim 17, wherein the ADC circuit supplies the first plurality of samples of the first data at the first data rate under control of a voltage controlled oscillator (VCO).

20. A system in accordance with claim 17, further including:
a clock circuit configured to generate a first clock signal; and
a clock divider circuit, which receives the first clock signal, the clock divider circuit being configured to output a second clock signal in response to the first clock signal;
wherein the circuit configured to receive the first plurality of samples receives the first plurality of samples of the first data at the first data rate in response to the first clock signal; and
wherein the circuit supplies the plurality of samples of second data at the second data rate in response to the second clock signal.

21. An apparatus in accordance with claim 17, wherein the filter circuit reduces aliasing noise.

22. An apparatus, comprising:
an analog-to-digital converter (ADC) circuit configured to receive an input signal and sample the input signal at a sampling rate to supply a first plurality of samples of first data at a first data rate; and
a digital signal processor including:
a circuit configured to receive the first plurality of samples of the first data at the first data rate and supply a plurality of samples of second data at a second data rate, the second data rate being less than the first data rate; and
a portion configured to receive the plurality of samples of the second data at the second data rate,
wherein the circuit configured to receive the first plurality of samples includes:
a memory configured to receive the first plurality of samples of the first data at the first data rate and output a second plurality of samples of the first data at a second data rate less than the first data rate; and a filter circuit configured to receive the second plurality of samples of the first data from the memory at the second data rate and supply a plurality of samples of second data at a second data rate.

23. An apparatus in accordance with claim 22, wherein the filter circuit includes a finite-impulse-response (FIR) circuit.

24. An apparatus in accordance with claim 22, wherein the ADC circuit supplies the first plurality of samples of the first data at the first data rate under control of a clock circuit.

25. An apparatus in accordance with claim 24, wherein the clock circuit includes a voltage controlled oscillator (VCO).

26. An apparatus in accordance with claim 22, further including:
  a clock circuit configured to generate a first clock signal; and
  a clock divider circuit, which receives the first clock signal, the clock divider circuit being configured to output a second clock signal in response to the first clock signal;
  wherein the circuit configured to receive the first plurality of samples receives the first plurality of samples of the first data at the first data rate in response to the first clock signal; and
  wherein the circuit configured to receive the first plurality of samples supplies the plurality of samples of second data at the second data rate in response to the second clock signal.

27. An apparatus in accordance with claim 22, wherein the plurality of samples of second data have an associated first frequency, the filter circuit being configured to attenuate signals having a second frequency greater than the first frequency, such that the filter circuit has a low pass characteristic.

28. An apparatus in accordance with claim 27, wherein the filter circuit reduces aliasing noise.

29. An apparatus, comprising:
  an analog-to-digital converter (ADC) circuit configured to receive an input signal and sample the input signal at a sampling rate to supply a plurality of samples of first data at a first data rate;
  a filter circuit configured to receive the plurality of samples of the first data at the first data rate and supply a first plurality of samples of second data at the first data rate;
  a memory circuit configured to receive the first plurality of samples of the second data at the first data rate and having circuitry to supply a second plurality of samples of the second data at a second data rate less than the first data rate; and
  a digital signal processor, a portion of which being configured to receive the second plurality of samples of second data at the second data rate.

30. An apparatus, comprising:
  an analog-to-digital converter (ADC) circuit configured to receive an input signal and sample the input signal at a sampling rate to supply a first plurality of samples of first data at a first data rate;
  a memory configured to receive the first plurality of samples of the first data at the first data rate and having circuitry to output a second plurality of samples of the first data at a second data rate less than the first data rate;
  a filter circuit configured to receive the second plurality of samples of the first data from the memory at the second data rate and supply a plurality of samples of second data at the second data rate; and
  a digital signal processor, a portion of which being configured to receive the plurality of samples of second data at the second data rate,
  wherein each of the first plurality of samples of the first data includes a first number of bits, each of the second plurality of samples of the first data includes a second number of bits, and each of the plurality of samples of the second data includes a third number of bits, the first number of bits being different than the second number of bits, and the first number of bits being different than the third number of bits.

31. An apparatus in accordance with claim 30, an apparatus in accordance with claim 1, wherein the memory includes a first-in-first-out (FIFO) buffer circuit.

32. An apparatus in accordance with claim 30, wherein the ADC circuit supplies the first plurality of samples of the first data at the first data rate under control of a clock circuit.

33. An apparatus in accordance with claim 32, wherein the clock circuit includes a voltage controlled oscillator (VCO).

34. An apparatus in accordance with claim 30, further including:
  a clock circuit configured to generate a first clock signal; and
  a clock divider circuit, which receives the first clock signal, the clock divider circuit being configured to output a second clock signal in response to the first clock signal;
  wherein the memory receives the first plurality of samples of the first data at the first data rate in response to the first clock signal; and
  wherein the memory outputs the second plurality of samples of the first data at the second data rate in response to the second clock signal.

35. An apparatus in accordance with claim 30, wherein the filter circuit includes a finite-impulse response (FIR) filter circuit.

36. An apparatus in accordance with claim 30, wherein the plurality of samples of second data have an associated second frequency, the filter circuit being configured to attenuate signals having first frequency greater than the second frequency, such that the filter circuit is configured to have a low-pass characteristic.

* * * * *